United States Patent
Huang et al.

(10) Patent No.: US 8,836,004 B2
(45) Date of Patent: Sep. 16, 2014

(54) MEMORY DEVICE

(75) Inventors: Yu-Fong Huang, Hsinchu (TW); I-Shen Tsai, Hsinchu (TW); Shang-Wei Lin, Hsinchu (TW); Miao-Chih Hsu, Hsinchu (TW); Kuan-Fu Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 815 days.

(21) Appl. No.: 12/724,053

(22) Filed: Mar. 15, 2010

(65) Prior Publication Data
US 2011/0220986 A1    Sep. 15, 2011

(51) Int. Cl.
*H01L 29/76*       (2006.01)
*H01L 27/115*      (2006.01)
*H01L 29/792*      (2006.01)

(52) U.S. Cl.
CPC ........ *H01L 29/792* (2013.01); *H01L 27/11568* (2013.01)
USPC ........... 257/314; 257/315; 257/329; 257/330; 257/331; 257/E29.309; 257/E29.304

(58) Field of Classification Search
USPC ........... 257/314–315, 329–331, E29.309, 324
See application file for complete search history.

(56) References Cited

U.S. PATENT DOCUMENTS

| | | | |
|---|---|---|---|
| 6,486,028 B1 | 11/2002 | Chang et al. | |
| 7,314,798 B2 * | 1/2008 | Chindalore et al. | 438/259 |
| 2009/0026460 A1 * | 1/2009 | Ou et al. | 257/66 |

OTHER PUBLICATIONS

Zhou et al., "VDNROM: A Novel Four-Bits-Per-Cell Vertical Channel Dual-Nitride-Trapping-Layer ROM for High Density Flash Memory Applications", Solid-State Device Research Conference, 2006. ESSDERC 2006. Proceeding of the 36th European Digital Object Identifier: 10.1109/DSSDER.2006.307679 Publication Year: 2006, pp. 226-229.

* cited by examiner

*Primary Examiner* — Samuel Gebremariam
(74) *Attorney, Agent, or Firm* — J.C. Patents

(57) ABSTRACT

A memory device including a substrate, a conductive layer, a charge storage layer, first and second dopant regions and first and second cell dopant regions is provided. A plurality of trenches is deployed in the substrate. The conductive layer is disposed on the substrate and fills the trenches. The charge storage layer is disposed between the substrate and the conductive layer. The first and second dopant regions having a first conductive type are configured in the substrate under bottoms of the trenches and in an upper portion of the substrate between two adjacent trenches, respectively. The first and second cell dopant regions having a second conductive type are configured in the substrate between lower portions of side surfaces of the trenches and in the substrate adjacent to the bottoms of the second dopant regions, respectively. The first and the second conductive types are different dopant types.

18 Claims, 5 Drawing Sheets

MEMORY DEVICE

BACKGROUND OF THE INVENTION

1. Field of the Invention

The invention relates to a memory device and a method of fabricating the same, and particularly to a memory device having a vertical cell and a method of fabricating the same.

2. Description of Related Art

Memories are semiconductor devices used for storing information or data. With the development of powerful microprocessors, the software is capable of programming and calculating increasing amount of data. Thus, the demand for the capacity of memories increases. In various memory products, non-volatile memories allow multiple times of data programming, reading, and erasing. The data stored therein are retained even after power to the memories is turned off In light of the aforementioned advantages, non-volatile memories have become one of the most widely-adopted memories in personal computers and other electronic equipments.

The electrically erasable programmable read only memories (EEPROMs) in non-volatile memories possess the ability to store, read and erase data for multiple times. Moreover, the EEPROMs have the advantage of not losing the stored data even after power of the system has been turned off. Therefore, the EEPROMs are widely used in the personal computers and electronic equipments. Typical EEPROMs fabricate floating gates and control gates from doped polysilicon. When the memory is being programmed, the electrons implanted into the floating gate are uniformly distributed in an entire polysilicon floating gate layer. However, if the tunnel oxide layer under the polysilicon floating gate layer has defects, it can easily cause a leakage current in the device, thereby affecting the reliability of the device.

Therefore, in order to solve the issue of current leakage in the EEPROM device, a conventional method utilizes stacked gate structures having a nonconductive charge storage layer to replace the polysilicon floating gate. Moreover, another advantage obtained from replacing the polysilicon floating gate with the charge storage layer is that the electrons are only locally stored in a neighboring portion of the channel region above the source region or the drain region while the device is programmed. Therefore, during the programming process, voltages can be respectively applied on the source region and the control gate at one end of the stacked gate structure. Furthermore, at the silicon nitride layer of the drain region near another end of the stacked gate structure, electrons are generated with a form of Gaussian distribution. Alternatively, voltages can be respectively applied on the drain region and the control gate of one end of the stacked gate structure. Moreover, at the silicon nitride layer of the source region near another end of the stacked gate structure, electrons are generated with a form of Gaussian distribution. In other words, by changing the voltages applied to the control gate and to either the source region or the drain region at the two sides, a single silicon nitride layer can have two storage regions that have electrons with a Gaussian distribution property, either one of the storage regions having electrons with the Gaussian distribution property, or none of the electrons stored in both storage regions. Hence, for this type of flash memory with the silicon nitride material replacing the floating gate, a single memory cell can be written with four different states. Therefore, this type of flash memory is considered a 2-bit-per-cell memory.

Conventionally, in order to increase the number of bits of a memory cell, a memory structure with a vertical memory cell is developed. This type of memory cell is a 4-bit-per-cell flash memory. However, between two vertically adjacent bits in the memory, the phenomenon of charge punch through happens easily. Hence, a severe leakage current in the memory structure is induced. In addition, the memory structure of the vertical cell further has problems such as asymmetric threshold voltages and asymmetric programming speeds, which consequently reduce the performance of the memory device having the vertical cell.

How to achieve a higher memory density while solving the problems aforementioned for the memory device to maintain device performance at a certain level is the most important issue to be solved.

SUMMARY OF THE INVENTION

Accordingly, the invention is directed to a memory device having superior device performance.

The invention is directed to a method of fabricating a memory device capable of solving the electric property issues in the memory device having a vertical cell effectively.

An embodiment of the invention is directed to a memory device including a substrate, a conductive layer, a charge storage layer, a plurality of first dopant regions, a plurality of second dopant regions, and a plurality of cell dopant regions. The substrate has a plurality of trenches. The conductive layer is disposed on the substrate and fills the trenches. The charge storage layer is disposed between the substrate and the conductive layer. The first dopant regions have a first conductive type and are disposed in the substrate under bottoms of the trenches respectively. The second dopant regions have the first conductive type and are disposed in the substrate between two adjacent trenches respectively. The cell dopant regions have the second conductive type and are disposed in the substrate between side surfaces of the trenches respectively. Here, the first conductive type and the second conductive type are different dopant types.

According to an embodiment of the invention, the memory device further includes a well region having the second conductive type and disposed in the substrate under the first dopant regions.

According to an embodiment of the invention, in the memory device, a width of each first dopant region is greater than a width of each trench.

According to an embodiment of the invention, in the memory device, the cell dopant regions include a plurality of first cell dopant regions and a plurality of second cell dopant regions. The first cell dopant regions are disposed in the substrate between lower portions of the side surfaces of the trenches respectively. The second cell dopant regions are disposed in the substrate adjacent to bottoms of the second dopant regions respectively.

According to an embodiment of the invention, the memory device further includes a bottom dielectric layer and a top dielectric layer. The bottom dielectric layer is disposed between the charge storage layer and the substrate. The top dielectric layer is disposed between the charge storage layer and the conductive layer.

According to an embodiment of the invention, the memory device further includes a metal silicide layer disposed on the conductive layer.

An embodiment of the invention is directed to a method of fabricating a memory device, and the method includes the following steps. A plurality of cell dopant regions is formed in a substrate. A plurality of side surfaces, a plurality of upper surfaces, and a plurality of lower surfaces are formed in the substrate. The cell dopant regions are disposed in the substrate between the side surfaces. A plurality of first dopant regions and a plurality of second dopant regions are formed in the substrate. The first dopant regions are disposed in the substrate under the lower surfaces respectively. The second dopant regions are disposed in the substrate under the upper surfaces respectively. Here, the dopant regions have the first conductive type, and a plurality of first cell dopant regions and a plurality of second cell dopant regions have the second conductive type. The first conductive type and the second conductive type are different dopant types. A charge storage layer is formed on the substrate. A conductive layer is formed on the substrate. The conductive layer covers the charge storage layer.

According to an embodiment of the invention, in the method of fabricating the memory device, the cell dopant regions include a plurality of first cell dopant regions and a plurality of second cell dopant regions. The first cell dopant regions are disposed in the substrate between lower portions of the side surfaces respectively. The second cell dopant regions are disposed in the substrate adjacent to bottoms of the second dopant regions respectively.

According to an embodiment of the invention, the method of fabricating the memory device further includes forming a well region before forming the cell dopant regions, where the well region is disposed in the substrate under the cell dopant regions.

According to an embodiment of the invention, in the method of fabricating the memory device, a method of forming of the side surfaces, the upper surfaces, and the lower surfaces includes forming a plurality of trenches in the substrate.

According to an embodiment of the invention, in the method of fabricating the memory device, a method of forming the trenches includes performing a patterning process to the substrate so as to remove a portion of the substrate having the cell dopant regions.

According to an embodiment of the invention, in the method of fabricating the memory device, a width of each first dopant region is greater than a width of each lower surface.

According to an embodiment of the invention, in the method of fabricating the memory device, a method of forming the first dopant regions and the second dopant regions includes the following. A sacrificial oxide layer is conformally formed on the substrate and surfaces of the trenches. An ion implantation process is performed to the substrate. The sacrificial oxide layer is removed.

According to an embodiment of the invention, in the method of fabricating the memory device, a method of forming the first dopant regions and the second dopant regions includes the following. The side surfaces are formed in the substrate and each bottom of the side surfaces has a tilted surface. The sacrificial oxide layer is conformally formed on a surface of the substrate. An ion implantation process is performed to the substrate. The sacrificial oxide layer is removed.

Another embodiment of the invention is directed to a memory device including a substrate, a conductive layer, a charge storage layer, a plurality of first dopant regions, a plurality of second dopant regions, and a plurality of cell dopant regions. The substrate includes a plurality of side surfaces, a plurality of upper surfaces, and a plurality of lower surfaces. The conductive layer is disposed on the substrate. The charge storage layer is disposed between the substrate and the conductive layer. The first dopant regions have the first conductive type and are disposed in the substrate under the lower surfaces respectively. The second dopant regions have the first conductive type and are disposed in the substrate under the upper surfaces respectively. The cell dopant regions have the second conductive type and are disposed in the substrate between side surfaces respectively. Here, the first conductive type and the second conductive type are different dopant types.

According to another embodiment of the invention, the memory device further includes a well region having the second conductive type and disposed in the substrate under the first dopant regions.

According to another embodiment of the invention, in the memory device, a width of each first dopant region is greater than a width of each lower surface.

According to another embodiment of the invention, in the memory device, the cell dopant regions include a plurality of first cell dopant regions and a plurality of second cell dopant regions. The first cell dopant regions are disposed in the substrate between lower portions of the side surfaces respectively. The second cell dopant regions are disposed in the substrate adjacent to bottoms of the second dopant regions respectively.

According to another embodiment of the invention, the memory device further includes a bottom dielectric layer and a top dielectric layer. The bottom dielectric layer is disposed between the charge storage layer and the substrate. The top dielectric layer is disposed between the charge storage layer and the conductive layer.

According to another embodiment of the invention, the memory device further includes a metal silicide layer disposed on the conductive layer.

In light of the foregoing, since the memory device of the embodiment of the invention has the first cell dopant region and the second cell dopant region, the memory device has advantages of symmetric threshold voltages, generation of thermal electrons, and prevention of charge punch through between two vertically adjacent bits. Moreover, the memory device is capable of enhancing the performance of the memory device effectively.

Moreover, when the width of each first dopant region is greater than the width of each trench (or each lower surface), the reduction of programming speed of the cell in a top portion is prevented, so that the memory device has symmetrical programming speeds, thereby enlarging the operation margin of the memory device.

Furthermore, the method of fabricating the memory device of the embodiment of the invention effectively solves the electric property issue of the memory device having the vertical cell. Therefore, the size of the cell can be further reduced by adopting the method of fabricating the memory device of the embodiment of the invention to enhance storage density.

In order to make the aforementioned and other features and advantages more comprehensible, embodiments accompanying figures are described in detail below.

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1D are cross-sectional views showing a flowchart of fabricating a memory device according to an embodiment of the invention.

Figure 1A:
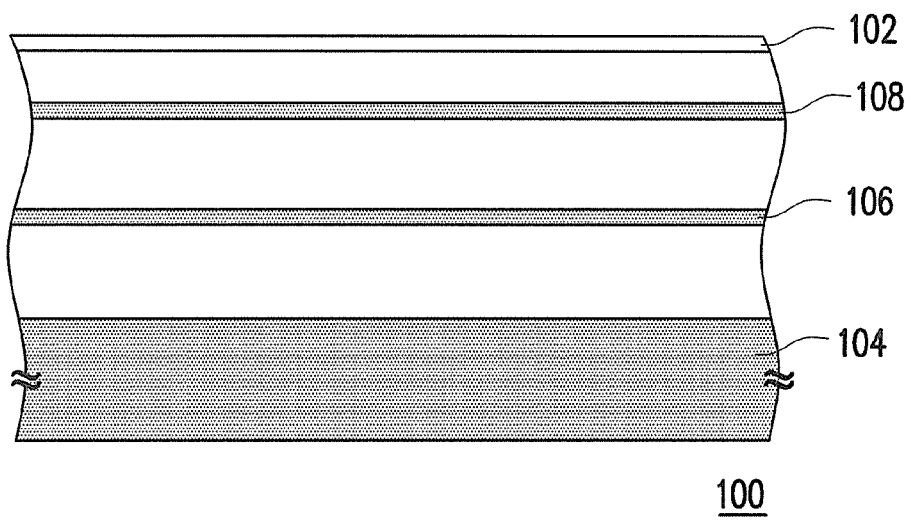
FIGS. 1A through 1D are cross-sectional views showing a flowchart of fabricating a memory device according to an embodiment of the invention.

Referring to FIG. 1A, a sacrificial oxide layer 102 is formed on a substrate 100. The sacrificial oxide layer 102 is, for example, made of silicon oxide. The sacrificial oxide layer 102 is formed by a thermal oxidation process, for example.

A well region 104 is optionally formed in the substrate 100. The well region 104 is formed by an ion implantation process, for instance, and is implanted with P-type dopant so as to obtain a P-type conductivity, for example. An ion implantation energy of forming the well region 104 is from 250 KeV to 350 KeV, for example, and an implanted ion concentration thereof is from $1 \times 10^{13}/cm^2$ to $5 \times 10^{13}/cm^2$, for example.

A first cell dopant region 106 is formed in the substrate 100 above the well region 104. The first cell dopant region 106 and the well region 104 are separated from each other. The first cell dopant region 106 is formed by an ion implantation process, for instance, and is implanted with P-type dopant so as to obtain a P-type conductivity, for example. An ion implantation energy of forming the first cell dopant region 106 is from 60 KeV to 80 KeV, for example, and an implanted ion concentration thereof is from $1 \times 10^{13}/cm^2$ to $1 \times 10^{14}/cm^2$, for example.

A second cell dopant region 108 is formed in the substrate 100 above the first cell dopant region 106. The second cell dopant region 108 and the first cell dopant region 106 are separated from each other. The second cell dopant region 108 is formed by an ion implantation process, for instance, and is implanted with P-type dopant so as to obtain a P-type conductivity. An ion implantation energy of forming the second cell dopant region 108 is from 10 KeV to 30 KeV, for example, and an implanted ion concentration thereof is from $1 \times 10^{13}/cm^2$ to $1 \times 10^{14}/cm^2$, for example.

Figure 1B:
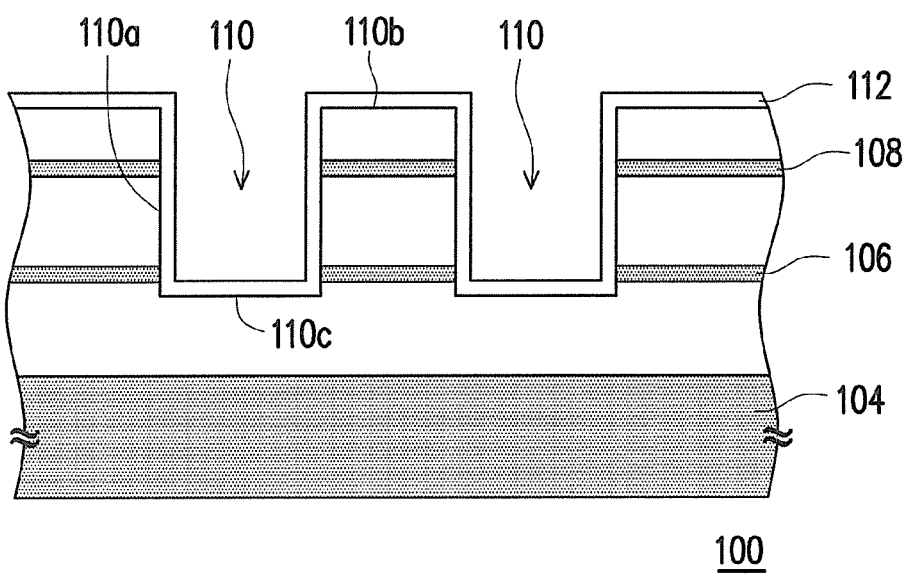

Referring to FIG. 1B, the sacrificial oxide layer 102 is removed. The sacrificial oxide layer 102 is removed by a wet etching process, for example.

A plurality of side surfaces 110a, a plurality of upper surfaces 110b, and a plurality of lower surfaces 110c are formed in the substrate 100. The side surfaces 110a, the upper surfaces 110b, and the lower surfaces 110c are formed by, for instance, forming a plurality of trenches 110 in the substrate 100, where the trenches 110 include the side surfaces 110a and the lower surfaces 110c. The first cell dopant region 106 and the second cell dopant region 108 are disposed in the substrate 100 between the side surfaces 110a. The first cell dopant region 106 is disposed between lower portions of the side surfaces 110a of the trenches 110 respectively. In a method of forming the trenches 110, a patterning process is performed to the substrate 100, for example, to remove a portion of the substrate 100 having the first cell dopant region 106 and the second cell dopant region 108.

A sacrificial oxide layer 112 is conformally formed on the substrate 100 and surfaces of the trenches 110. The thickness of the sacrificial oxide layer 112 is 50 Å to 100 Å, for example. The sacrificial oxide layer 112 is, for example, made of silicon oxide. The sacrificial oxide layer 112 is formed by a re-oxidation process, for example.

When the thickness of the sacrificial oxide layer 112 is 50 Å to 100 Å, the first buried dopant regions (notated as 114 in FIG. 1C) and the second buried dopant regions (notated as 116 in FIG. 1C) are prevented from bridging when formed by the ion implantation process, and the first buried dopant regions have superior extension effect.

Figure 1C:
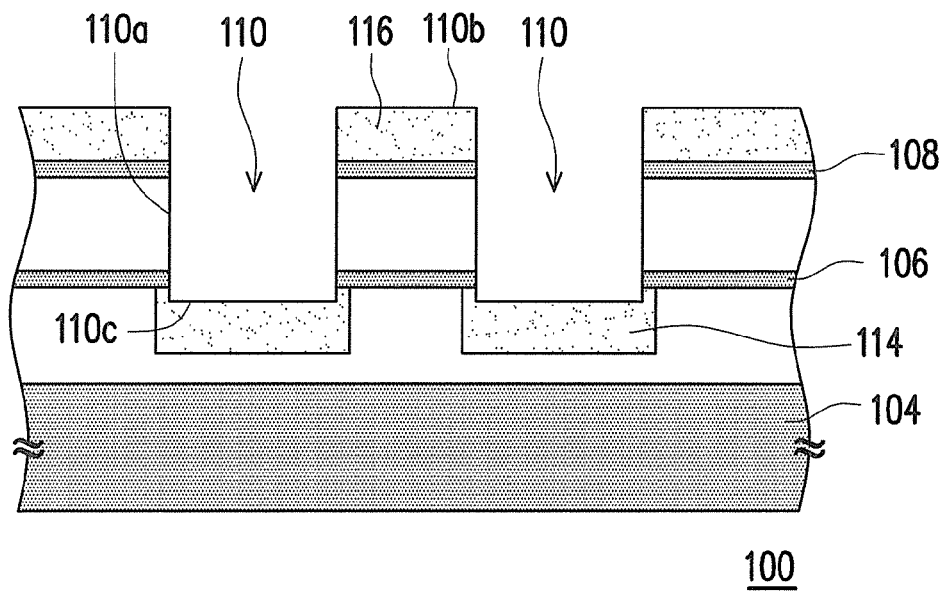

Referring to FIG. 1C, an ion implantation process is performed to the substrate 100 so as to form the first buried dopant regions 114 disposed under the lower surfaces 110c and the second buried dopant regions 116 disposed under the upper surfaces 110b. Here, ions implanted are N-type dopant, for example, so that the first buried dopant regions 114 and the second buried dopant regions 116 have an N-type conductivity. An ion implantation energy of forming the first buried dopant regions 114 and the second buried dopant regions 116 is from 10 KeV to 25 KeV, for example, and an implanted ion concentration thereof is from $1 \times 10^{15}/cm^2$ to $5 \times 10^{15}/cm^2$, for example.

It should be noted that the first buried dopant regions 114 and the second buried dopant region 116 have the same first conductivity, the well region 104, the first cell dopant region 106, and the second cell dopant region 108 have the same second conductivity, and the first conductive type and the second conductive type are different dopant types, and the conductive type of the dopant regions is not limited to the present embodiment.

When the ion implantation process adopted is the tilted angle ion implantation method, the width of each first buried dopant region 114 can be greater than the width of each trench 110 (or each lower surface 110c), so that the first buried dopant regions 114 have a larger extension range. The extension of the first buried dopant regions 114 prevents the programming speed of the cell in a top portion from being reduced. As a result, the memory device has symmetric programming speeds and the operation margin of the memory device is enlarged.

The first buried dopant regions 114 are disposed in the substrate 100 under bottoms of the trenches 110 respectively. The second buried dopant regions 116 are disposed in an upper portion of the substrate 100 between two adjacent trenches 110 respectively. Moreover, the second cell dopant region 108 is adjacent to bottoms of the second buried dopant regions 116.

By adjusting the dopant type and disposition of the first cell dopant region 106 and the second cell dopant region 108, the memory device then has advantages of symmetric threshold voltages, larger electric field intensity for generating thermal electrons, and prevention of charge punch through between two vertically adjacent bits, and is capable of enhancing the performance of the memory device effectively.

The sacrificial oxide layer 112 is removed. The sacrificial oxide layer 112 is removed by a wet etching process, for example.

Figure 1D:
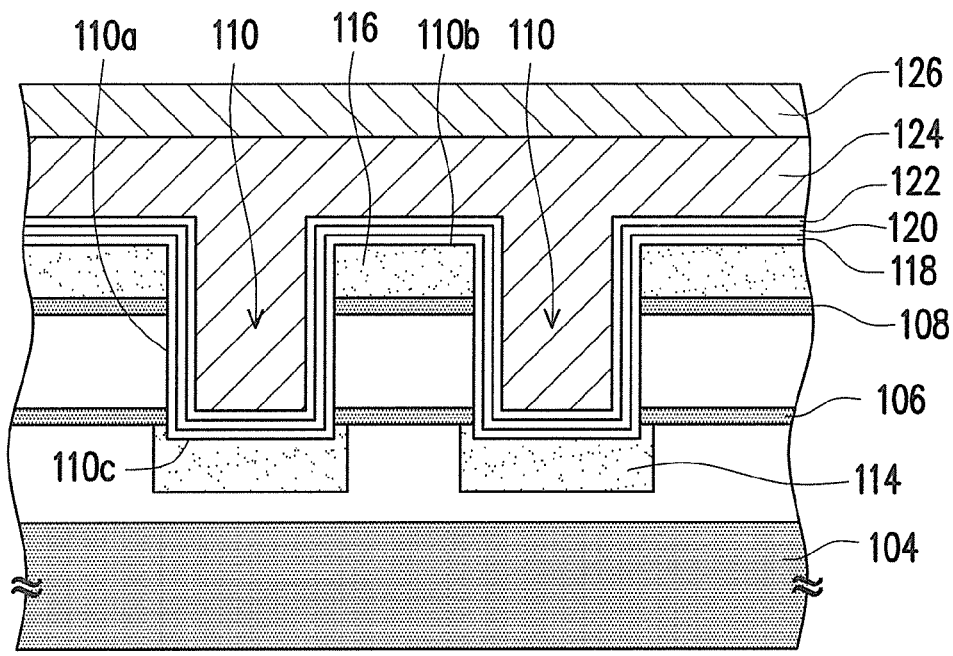

Referring to FIG. 1D, a bottom dielectric layer 118, the charge storage layer 120, and the top dielectric 122 are sequentially formed on the substrate 100 and the surfaces of the trenches 110 in a conformal manner. Here, the bottom dielectric layer 118 and the top dielectric layer 122 can be optionally formed. The bottom dielectric layer 118 is, for example, made of a material having a low dielectric constant or a high dielectric constant. In one embodiment, the bottom dielectric layer 118 is in a single-layer structure form or a multiple-layer structure form based on bandgap engineering. The single-layer bottom dielectric layer 118, for example, is made of silicon oxide or hafnium aluminum oxide. The multiple-layer bottom dielectric layer 118 is a structure stacked with low dielectric constant/high dielectric constant materials or a structure stacked with low dielectric constant/high dielectric constant/low dielectric constant materials, such as silicon oxide/hafnium silicon oxide, silicon oxide/hafnium oxide, silicon oxide/silicon nitride, silicon oxide/silicon nitride/silicon oxide or silicon oxide/aluminum oxide/silicon oxide. The bottom dielectric layer 118 is formed by a thermal oxidation process, for example. The charge storage layer 120 is made of a charge trapping material, such as silicon nitride. The charge trapping layer 120 is formed by, for example, a chemical vapor deposition (CVD) process. The top dielectric layer 122 is made of a dielectric material in a single-layer structure form, and the dielectric material includes silicon oxide, hafnium aluminum oxide, or aluminum oxide, for example. The top dielectric layer 122 is formed by, for example, a CVD process.

Thereafter, a conductive layer 124 is formed on the substrate 100. The conductive layer 124 covers the top dielectric layer 122 and fills the trenches 110, for instance. The conductive layer 124 is, for example, made of doped polysilicon. The conductive layer 124 is formed by, for example, a CVD process.

A metal silicide layer 126 is optionally formed on the conductive layer 124 to reduce the resistance of the device and increase the conductivity thereof. The metal silicide layer 126 is, for example, made of tungsten silicide. The metal silicide layer 126 is, for example, formed by a CVD process.

As illustrated in the embodiments aforementioned, the memory device fabricated using the above-mentioned methods has the first cell dopant region 106 and the second cell dopant region 108. Thus, the memory device has advantages of symmetric threshold voltages, generation of thermal electrons, and prevention of charge punch through between two vertically adjacent bits. Moreover, the memory device is capable of enhancing the performance of the memory device effectively.

Moreover, when the width of each first buried dopant region 114 is greater than the width of each trench 110 (or each lower surface 110c) (that is, the extension range is greater), the reduction of programming speed of the cell in a top portion is prevented, so that the memory device has symmetrical programming speeds, thereby enlarging the operation margin of the memory device.

In addition, since the electric property issue of the memory device having the vertical cell is effectively solved, the size of the cell can be further reduced to increase storage density.

It should be noted that a formation method for the width of each first buried dopant region 114 to be greater than the width of each trench 110 (or each lower surface 110c) is not limited to the embodiments aforementioned. In the following, other methods of forming the first buried dopant regions 114 and the second buried dopant regions 116 are illustrated through other embodiments.

Figure 2A:
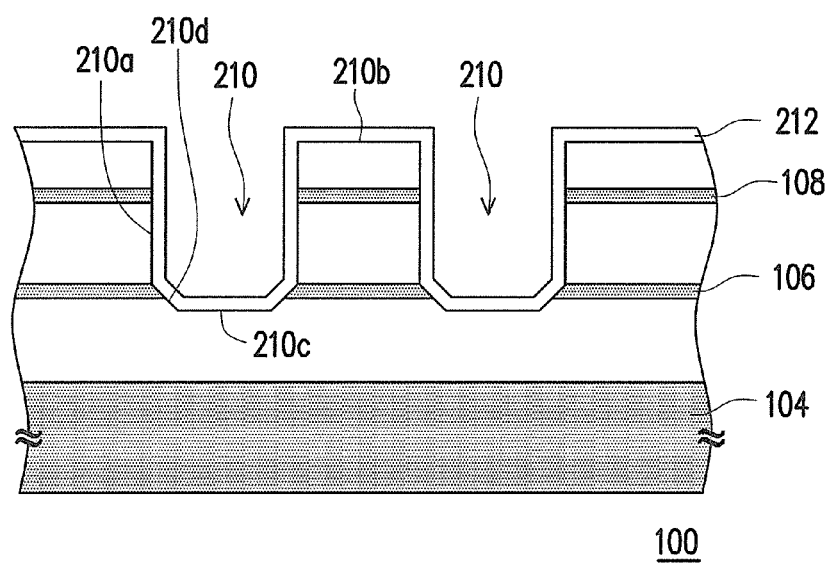
FIGS. 2A and 2B are cross-sectional views showing a flowchart of fabricating first buried dopant regions and second buried dopant regions according to another embodiment of the invention.
Figure 2B:
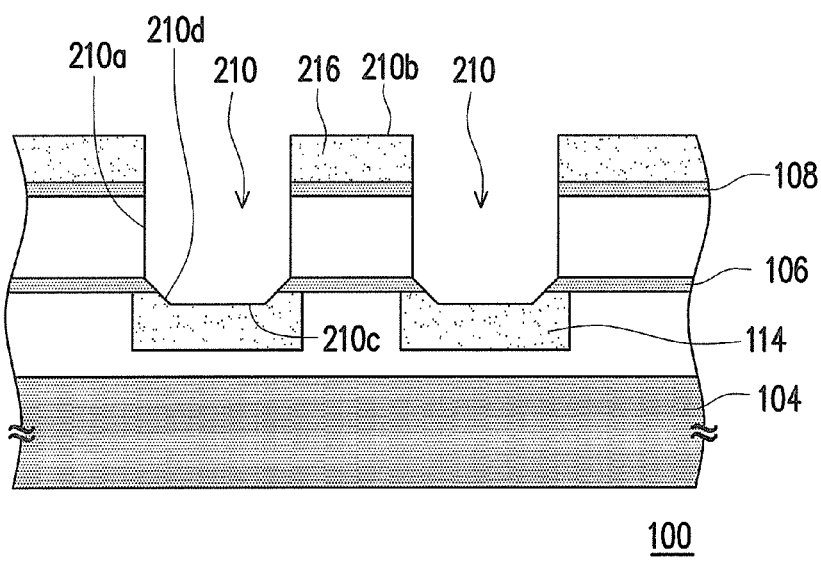

FIGS. 2A and 2B are cross-sectional views showing a flowchart of fabricating first buried dopant regions and second buried dopant regions according to another embodiment of the invention. Herein, the same reference numbers are used to refer to the same parts in FIG. 1A, and the same descriptions are omitted as well.

Referring FIG. 2A, the sacrificial oxide layer 102 is removed after the steps in FIG. 1A have been performed. The sacrificial oxide layer 102 is removed by a wet etching process, for example.

Thereafter, a plurality of side surfaces 210a, a plurality of upper surfaces 210b, and a plurality of lower surfaces 210c are formed in the substrate 100 so as to form a plurality of trenches 210 including the side surfaces 210a and the lower surfaces 210c. The bottoms of the side surfaces 210a of the trenches 210 each have a tilted surface 210d. The first cell dopant region 106 is disposed between lower portions of the side surfaces 210a of the trenches 210. In a method of forming the trenches 210, a patterning process is performed to the substrate 100, for example, to remove a portion of the substrate 100 having the first cell dopant region 106 and the second cell dopant region 108. The tilted surfaces 210d on the bottoms of the trenches 210 are formed by adjusting etching parameters in the etching process.

A sacrificial oxide layer 212 is conformally formed on the substrate 100 and surfaces of the trenches 210. The thickness of the sacrificial oxide layer 212 is 50 Å to 100 Å, for example. The sacrificial oxide layer 212 is, for example, made of silicon oxide. The sacrificial oxide layer 212 is formed by a re-oxidation process, for example.

Referring to FIG. 2B, an ion implantation process is performed to the substrate 100 so as to form the first buried dopant region 214 disposed under the lower surfaces 210c and the second buried dopant region 216 disposed under the upper surfaces 210b in the substrate 100. Moreover, the width of each first buried dopant region 214 is greater than the width of each trench 210. The first buried dopant regions 114 are disposed in the substrate 100 under the bottoms of the trenches 210 respectively. The second buried dopant regions 216 are disposed in an upper portion of the substrate 100 between two adjacent trenches 210 respectively. Moreover, the second cell dopant region 108 is adjacent to bottoms of the second buried dopant regions 216. Here, ions implanted are N-type dopant, for example, so that the first buried dopant regions 214 and the second buried dopant regions 216 have an N-type conductivity. The ion implantation process is, for example, a tilted angle ion implantation process. An ion implantation energy of forming the first buried dopant regions 214 and the second buried dopant regions 216 is from 10 KeV to 25 KeV, for example, and an implanted ion concentration thereof is from $1\times10^{15}/cm^2$ to $5\times10^{15}/cm^2$, for example.

The sacrificial oxide layer 212 is removed. The sacrificial oxide layer 212 is removed by a wet etching process, for example.

As illustrated in the embodiments aforementioned, since the bottoms of the trenches 210 have tilted surfaces 210d, when the first buried dopant regions 214 are formed by the ion implantation process, the first buried dopant regions 214 can have a larger extension range.

Figure 3A:
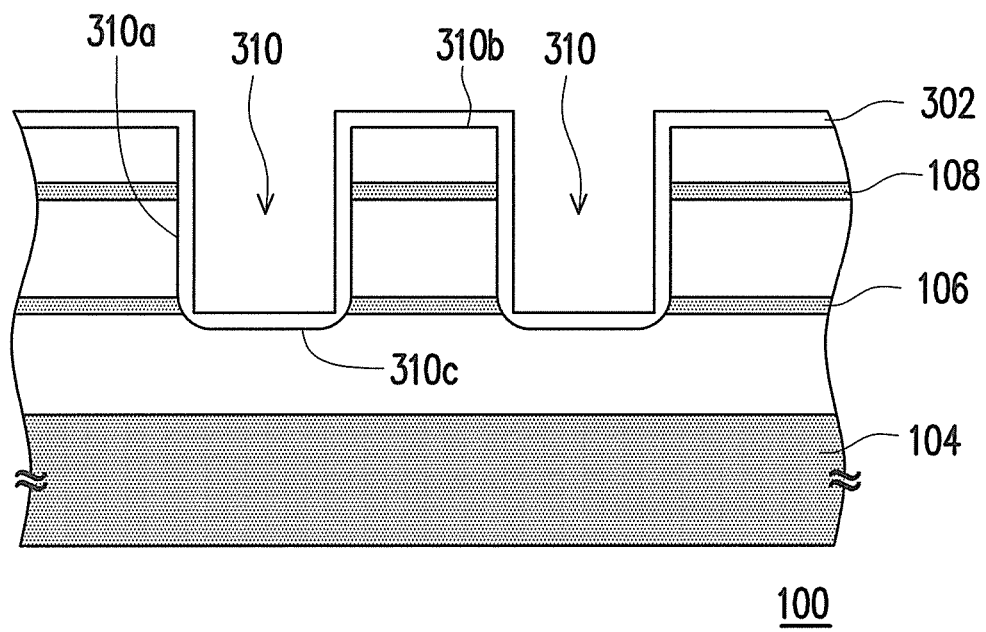
FIGS. 3A and 3C are cross-sectional views showing a flowchart of fabricating a plurality of first buried dopant regions and a plurality of second buried dopant regions according to another embodiment of the invention.
Figure 3B:
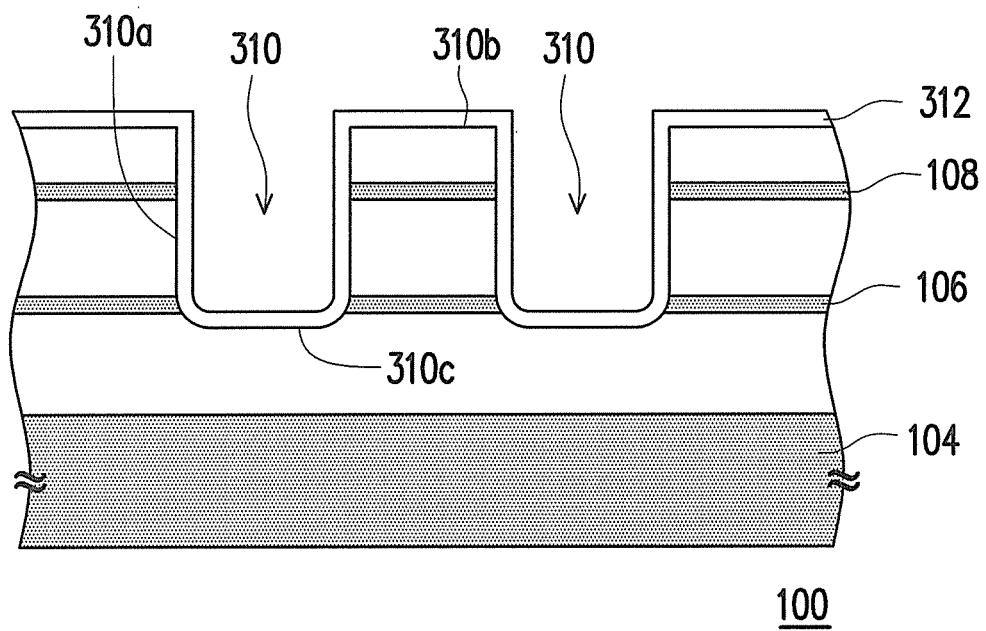
Figure 3C:
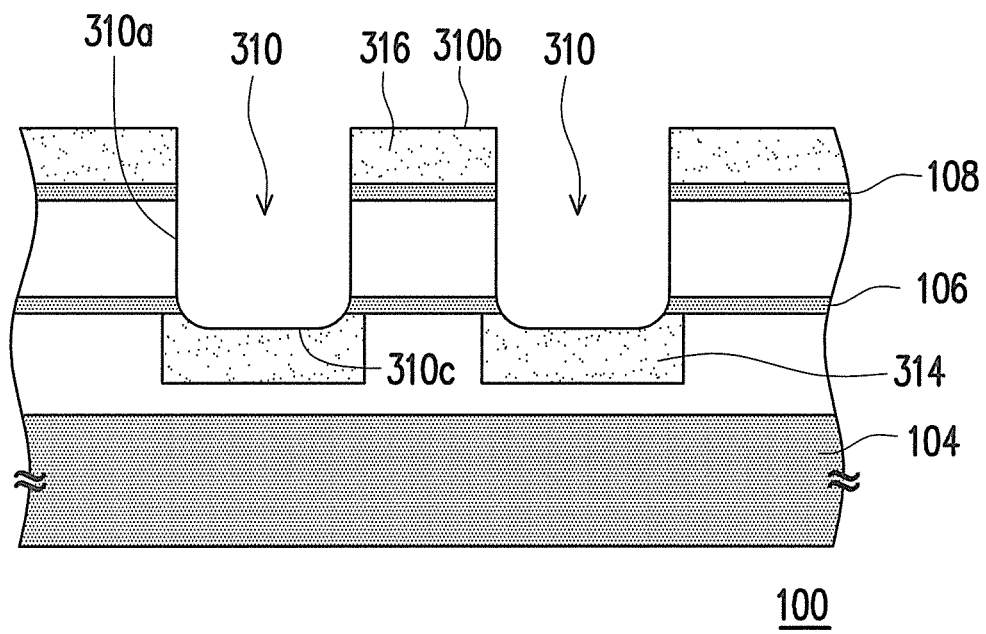

FIGS. 3A and 3C are cross-sectional views showing a flowchart of fabricating a plurality of first buried dopant regions and a plurality of second buried dopant regions according to another embodiment of the invention. Herein, the same reference numbers are used to refer to the same parts in FIG. 1A, and the same descriptions are omitted as well.

Referring to FIG. 3A, the sacrificial oxide layer 102 is removed after the steps in FIG. 1A have been performed. The sacrificial oxide layer 102 is removed by a wet etching process, for example.

Thereafter, a plurality of side surfaces 310a, a plurality of upper surfaces 310b, and a plurality of lower surfaces 310c are formed in the substrate 100 so as to form a plurality of trenches 310 including the side surfaces 310a and the lower surfaces 310c. The first cell dopant region 106 is disposed between lower portions of the side surfaces 310a of the trenches 310. In a method of forming the trenches 310, a patterning process is performed to the substrate 100, for example, to remove a portion of the substrate 100 having the first cell dopant region 106 and the second cell dopant region 108.

A modified oxide layer 302 is conformally formed on the substrate 100 and surfaces of the trenches 310. Additionally, corners of the bottoms of the trenches 310 are rounded in the process of forming the modified oxide layer 302. The modified oxide layer 302 is, for example, made of silicon oxide. The modified oxide layer 302 is formed by a re-oxidation process, for example.

As shown in FIG. 3B, the modified oxide layer 302 is removed. The modified oxide layer 302 is removed by a wet etching process, for example.

A sacrificial oxide layer 312 is conformally formed on the substrate 100 and surfaces of the trenches 310. The thickness of the sacrificial oxide layer 312 is 50 Å to 100 Å, for example. The sacrificial oxide layer 312 is, for example, made of silicon oxide. The sacrificial oxide layer 312 is formed by a re-oxidation process, for example.

Referring to FIG. 3C, an ion implantation process is performed to the substrate 100 so as to form the first buried dopant regions 314 disposed under the lower surfaces 310c and the second buried dopant regions 316 disposed under the upper surfaces 310b in the substrate 100. Moreover, the width of each first buried dopant region 314 is greater than the width of each trench 310. The first buried dopant regions 114 are disposed in the substrate 100 under the bottoms of the trenches 310 respectively. The second buried dopant regions 316 are disposed in an upper portion of the substrate 100 between two adjacent trenches 310 respectively. Moreover, the second cell dopant region 108 is adjacent to bottoms of the second buried dopant regions 316. Here, ions implanted are N-type dopant, for example, so that the first buried dopant regions 314 and the second buried dopant regions 316 have an N-type conductivity. The ion implantation process is, for example, a tilted angle ion implantation process. An ion implantation energy of forming the first buried dopant regions 314 and the second buried dopant regions 316 is from 10 KeV to 25 KeV, for example, and an implanted ion concentration thereof is from $1\times10^{15}/cm^2$ to $5\times10^{15}/cm^2$, for example.

The sacrificial oxide layer 312 is removed. The sacrificial oxide layer 312 is removed by a wet etching process, for example.

As illustrated in the embodiments aforementioned, since the bottoms of the trenches 310 are rounded, when the first buried dopant regions 314 are formed by the ion implantation process, the first buried dopant regions 314 can have a larger extension range.

In the following, FIG. 1D illustrates a memory device according to an embodiment of the invention.

Referring to FIG. 1D, a memory device includes a substrate 100, a plurality of first cell dopant regions 106, a plurality of second cell dopant regions 108, a plurality of first buried dopant regions 114, a plurality of second buried dopant regions 116, a charge storage layer 120, and a conductive layer 124. The substrate 100 includes a plurality of side surfaces 110a, a plurality of upper surfaces 110b, and a plurality of lower surfaces 110c so as to form a plurality of trenches 110 including the side surfaces 110a and the lower surfaces 110c. The conductive layer 124 is disposed on the substrate 100 and fills the trenches 110. The charge storage layer 120 is disposed between the substrate 100 and the conductive layer 124. The first buried dopant regions 114 have the first conductive type and are disposed in the substrate 100 under bottoms of the trenches 110 (that is, in the substrate 100 under the lower surfaces 110c) respectively. The width of each first buried dopant region 114 is greater than the width of each trench 110, for instance. The second buried dopant regions 116 have the first conductive type and are disposed in the upper portion of the substrate 100 between two adjacent trenches 110 (that is, in the substrate 100 under the upper surfaces 110b) respectively. The first cell dopant regions 106 and the second cell dopant regions 108 are disposed in the substrate 100 between the side surfaces 110a. The first cell dopant regions 106 have the second conductive type and are disposed in the substrate 100 between lower portions of the side surfaces 110a of the trenches 110 respectively. The second cell dopant regions 108 have the second conductive type and are disposed in the substrate 100 adjacent to bottoms of the second buried dopant regions 116 respectively. Here, the first conductive type and the second conductive type are different dopant types. The memory device optionally includes a well region 104, a bottom dielectric layer 118, a top dielectric layer 122, and a metal silicide layer 126. The well region 104 has the second conductive type and is disposed in the substrate 100 under the first buried dopant regions 114. The bottom dielectric layer 118 is disposed between the charge storage layer 120 and the substrate 100. The top dielectric layer 122 is disposed between the charge storage layer 120 and the conductive layer 124. The metal silicide layer 126 is disposed on the conductive layer 124. The materials, formations, and functions of the components in the memory device have been described in the embodiments above-mentioned, and therefore a detailed description thereof is not repeated herein.

As illustrated in the embodiments, since the first cell dopant regions 106 and the second cell dopant regions 108 of the memory device have the characteristic of controlling the top bit and bottom bit in the vertical cell, the performance of the memory device is enhanced effectively.

Moreover, when the width of each first buried dopant region 114 is greater than the width of each trench 110, the memory device has symmetrical programming speeds and the operation margin of the memory device is therefore enlarged.

In summary, the memory device and the method of fabricating the same in the aforementioned embodiments have at least the following advantages:

1. Since the memory device has the first cell dopant region and the second cell dopant region, the performance of the memory device is effectively enhanced.

2. When the width of each first buried dopant region is greater than the width of each trench (or each lower surface) in the memory device, the operation margin of the memory device is enlarged.

In addition, since the electric property issue of the memory device having the vertical cell is effectively solved, the size of the cell can be further reduced to increase storage density.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A memory device, comprising:
   a substrate, having a plurality of trenches;
   a conductive layer, disposed on the substrate and filling the trenches;
   a charge storage layer, disposed between the substrate and the conductive layer;
   a plurality of first dopant regions, having a first conductive type and disposed in the substrate under bottom surfaces of the trenches respectively;
   a plurality of second dopant regions, having the first conductive type and disposed in the substrate between two adjacent trenches respectively; and
   a plurality of cell dopant regions, having a second conductive type and respectively disposed in the substrate between side surfaces of the trenches, wherein the first conductive type and the second conductive type are different dopant types.

2. The memory device as claimed in claim 1, further comprising a well region having the second conductive type and disposed in the substrate under the first dopant regions.

3. The memory device as claimed in claim 1, wherein a width of each of the first dopant regions is greater than a width of each of the trenches.

4. The memory device as claimed in claim 1, wherein the cell dopant regions further comprising: a plurality of first cell dopant regions, disposed in the substrate between lower portions of the side surfaces of the trenches respectively;
a plurality of second cell dopant regions, disposed in the substrate adjacent to bottoms of the second dopant regions respectively.

5. The memory device as claimed in claim 4, wherein the first cell dopant region and the second cell dopant region between the two adjacent trenches are separated from each other.

6. The memory device as claimed in claim 1, further comprising: a bottom dielectric layer, disposed between the charge storage layer and the substrate; and
a top dielectric layer, disposed between the charge storage layer and the conductive layer.

7. The memory device as claimed in claim 1, further comprising a metal silicide layer disposed on the conductive layer.

8. The memory device as claimed in claim 1, wherein the plurality of cell dopant regions between the two adjacent trenches are separated from each other.

9. The memory device as claimed in claim 1, wherein each bottom of the side surfaces has a tilted surface or corners of bottoms of the trenches are rounded.

10. A memory device, comprising:
a substrate, having a plurality of trenches to define a plurality of side surfaces, a plurality of upper surfaces, and a plurality of lower surfaces;
a conductive layer, disposed on the substrate;
a charge storage layer, disposed between the substrate and the conductive layer;
a plurality of first dopant regions, having a first conductive type and disposed in the substrate under bottom surfaces of the trenches respectively;
a plurality of second dopant regions, having the first conductive type and disposed in the substrate under the upper surfaces respectively; and
a plurality of cell dopant regions, having a second conductive type and respectively disposed in the substrate between the side surfaces, wherein the first conductive type and the second conductive type are different dopant types.

11. The memory device as claimed in claim 10, further comprising a well region having the second conductive type and disposed in the substrate under the first dopant regions.

12. The memory device as claimed in claim 10, wherein a width of each of the first dopant regions is greater than a width of each of the lower surfaces.

13. The memory device as claimed in claim 10, wherein the cell dopant regions further comprising:
a plurality of first cell dopant regions, disposed in the substrate between lower portions of the side surfaces respectively; and
a plurality of second cell dopant regions, disposed in the substrate adjacent to bottoms of the second dopant regions respectively.

14. The memory device as claimed in claim 13, wherein the first cell dopant region and the second cell dopant region between the two adjacent trenches are separated from each other.

15. The memory device as claimed in claim 10, further comprising:
a bottom dielectric layer, disposed between the charge storage layer and the substrate; and
a top dielectric layer, disposed between the charge storage layer and the conductive layer.

16. The memory device as claimed in claim 10, further comprising a metal silicide layer disposed on the conductive layer.

17. The memory device as claimed in claim 10, wherein the plurality of cell dopant regions between the two adjacent trenches are separated from each other.

18. The memory device as claimed in claim 10, wherein each bottom of the side surfaces has a tilted surface or corners of bottoms of the trenches are rounded.

* * * * *